(12) United States Patent
Inoue et al.

(10) Patent No.: US 12,191,266 B2
(45) Date of Patent: Jan. 7, 2025

(54) SEMICONDUCTOR DEVICE AND MANUFACTURING METHOD OF SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Emiko Inoue, Nonoichi Ishikawa (JP); Yukie Nishikawa, Nonoichi Ishikawa (JP)

(73) Assignees: KABUSHIKI KAISHA TOSHIBA, Minato-Ku (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 300 days.

(21) Appl. No.: 17/692,779

(22) Filed: Mar. 11, 2022

(65) Prior Publication Data

US 2023/0091325 A1    Mar. 23, 2023

(30) Foreign Application Priority Data

Sep. 21, 2021   (JP) ................. 2021-153436

(51) Int. Cl.
*H01L 23/00*    (2006.01)
*H01L 29/423*   (2006.01)

(52) U.S. Cl.
CPC ............. *H01L 24/05* (2013.01); *H01L 24/03* (2013.01); *H01L 29/42304* (2013.01);
(Continued)

(58) Field of Classification Search
CPC ... H01L 24/05; H01L 24/03; H01L 29/42304; H01L 29/42376; H01L 2224/03614;
(Continued)

(56) References Cited

U.S. PATENT DOCUMENTS 7,893,489 B2 * 2/2011 Kobayashi .......... H01L 29/7809
257/341
8,981,424 B2 3/2015 Andou
(Continued)

FOREIGN PATENT DOCUMENTS

JP  H07-263484 A  10/1995
JP  H08-203952 A  8/1996
(Continued)

OTHER PUBLICATIONS

Japanese Office Action issued to the JP Patent Application No. 2021-153436 on Jun. 4, 2024 (9 pages).

*Primary Examiner* — Karen Kusumakar
*Assistant Examiner* — Shawn Shaw Muslim
(74) *Attorney, Agent, or Firm* — Foley & Lardner LLP

(57) ABSTRACT

A semiconductor device includes a silicon substrate, a first layer, a second layer, a barrier metal, and a gate pad. The first layer is formed of an oxide film provided on an upper surface of the silicon substrate. The second layer is a layer at least selectively having a projecting and recessed part on an upper surface of the first layer, the projecting and recessed part having a projection and recess deeper than a projection and recess occurring when the layer is formed in a planar shape. The barrier metal is formed on an upper surface of the second layer according to a shape of the projecting and recessed part. The gate pad is in close contact with the silicon substrate via the barrier metal.

20 Claims, 17 Drawing Sheets

(52) U.S. Cl.
CPC ............... *H01L 29/42376* (2013.01); *H01L 2224/03614* (2013.01); *H01L 2224/03622* (2013.01); *H01L 2224/05017* (2013.01); *H01L 2224/05018* (2013.01); *H01L 2224/05076* (2013.01); *H01L 2224/05082* (2013.01); *H01L 2224/05083* (2013.01); *H01L 2224/05084* (2013.01); *H01L 2224/05088* (2013.01); *H01L 2224/05138* (2013.01); *H01L 2224/05166* (2013.01); *H01L 2224/05181* (2013.01); *H01L 2224/05184* (2013.01); *H01L 2224/05186* (2013.01); *H01L 2224/05324* (2013.01); *H01L 2224/05338* (2013.01); *H01L 2224/05344* (2013.01); *H01L 2224/05347* (2013.01); *H01L 2224/05366* (2013.01); *H01L 2224/05384* (2013.01); *H01L 2224/05557* (2013.01); *H01L 2224/05564* (2013.01); *H01L 2924/13055* (2013.01); *H01L 2924/13091* (2013.01)

(58) Field of Classification Search
CPC . H01L 2224/03622; H01L 2224/05017; H01L 2224/05018; H01L 2224/05076; H01L 2224/05082; H01L 2224/05083; H01L 2224/05084; H01L 2224/05088; H01L 2224/05138; H01L 2224/05166; H01L 2224/05181; H01L 2224/05184; H01L 2224/05186; H01L 2224/05324; H01L 2224/05338; H01L 2224/05344; H01L 2224/05347; H01L 2224/05366; H01L 2224/05384; H01L 2224/05557; H01L 2224/05564; H01L 2924/13055; H01L 2924/13091; H01L 24/06; H01L 29/7393
See application file for complete search history.

(56) References Cited

U.S. PATENT DOCUMENTS

| | | |
|---|---|---|
| 9,698,103 B2 | 7/2017 | Iwasaki et al. |
| 9,947,574 B2 | 4/2018 | Nishikawa et al. |
| 2008/0251857 A1 | 10/2008 | Brown |
| 2022/0392815 A1 | 12/2022 | Shirakawa et al. |
| 2022/0392858 A1 | 12/2022 | Shirakawa et al. |

FOREIGN PATENT DOCUMENTS

| | | |
|---|---|---|
| JP | H11-121457 A | 4/1999 |
| JP | 2964999 B2 | 10/1999 |
| JP | 2008-277365 A | 11/2008 |
| JP | 2009-510758 A | 3/2009 |
| JP | 2013-125757 A | 6/2013 |
| JP | 2016-111084 A | 6/2016 |
| JP | 2016-171150 A | 9/2016 |
| JP | 7435804 B2 | 2/2024 |

* cited by examiner

SEMICONDUCTOR DEVICE AND MANUFACTURING METHOD OF SEMICONDUCTOR DEVICE

CROSS REFERENCE TO THE RELATED APPLICATIONS

This application is based upon and claims the benefit of priority from the prior Japanese Patent Application No. 2021-153436, filed on Sep. 21, 2021, the entire contents of which are incorporated herein by reference.

FIELD

Embodiments of the invention relate to a semiconductor device and a manufacturing method of a semiconductor device.

BACKGROUND

An IGBT (Insulated Gate Bipolar Transistor) is widely used as a power device for vehicle or electric railcar, or as a switching element or the like in an industrial apparatus or the like. In the IGBT, an oxide film, an interlayer film and so on are formed on a silicon substrate on which a drift, a collector and so on are to be formed, and a gate pad for applying a gate voltage via a barrier metal is formed thereon. If simply providing the gate pad on the barrier metal, the gate pad often peels off from the metal. To cope with this, there is a technique of forming polysilicon on the interlayer film and forming a silicide at the interface between the polysilicon and the barrier metal to improve the adhesiveness, but the adhesiveness is sometimes insufficient also in this case. Therefore, a further improvement in the technique is required.

DETAILED DESCRIPTION

Figure 1:
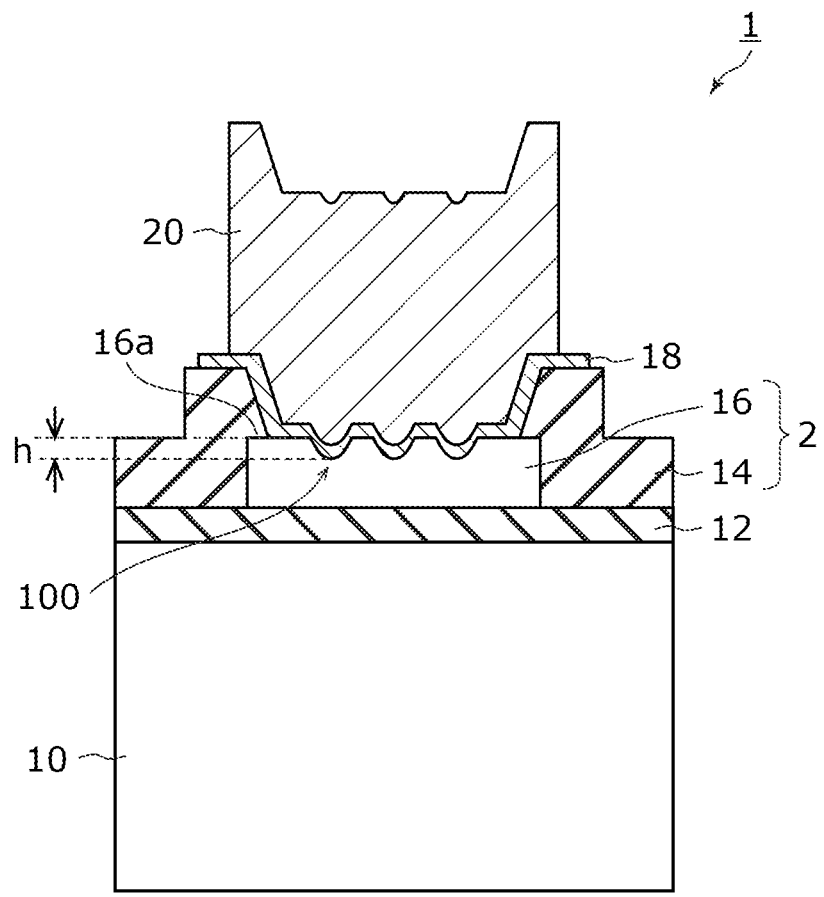
FIG. 1 is a sectional view schematically illustrating a part of a semiconductor device according to an embodiment.

According to one embodiment, a semiconductor device includes a silicon substrate, a first layer, a second layer, a barrier metal, and a gate pad. The first layer is formed of an oxide film provided on an upper surface of the silicon substrate. The second layer is a layer at least selectively having a projecting and recessed part on an upper surface of the first layer, the projecting and recessed part having a projection and recess deeper than a projection and recess occurring when the layer is formed in a planar shape. The barrier metal is formed on an upper surface of the second layer according to a shape of the projecting and recessed part. The gate pad is in close contact with the silicon substrate via the barrier metal.

Hereinafter, embodiments will be explained referring to the drawings. It should be noted that this disclosure explains the formation of a gate pad, and therefore the illustration and explanation of a semiconductor to be formed in a silicon substrate are omitted. Further, the ratio in size between elements, the aspect ratio or angle, and the like are changed for easy understanding of the structure in the drawings, but the contents of the embodiments are not limited to the ratios, and the elements are constituted in appropriate sizes. Further, a portion illustrated as having an angular shape may have a shape rounded at its angle depending on the specification of process such as etching or design configuration. Besides, the expression of an upper surface is used, and this indicates a surface on the upper side in the vertical direction in a general semiconductor process. Further, a projecting and recessed part is explained, and the number of grooves of the projecting and recessed part in each drawing is illustrated as a not-limited example and can be arbitrarily changed.

First Embodiment

FIG. 1 is a sectional view schematically illustrating a part of a semiconductor device according to a first embodiment.

A semiconductor device 1 is, for example, an IGBT (Insulated Gate Bipolar Transistor). The semiconductor device 1 includes a silicon substrate (semiconductor substrate) 10, an oxide film 12, an interlayer film 14, polysilicon 16, barrier metal 18, and a gate pad 20. The semiconductor device 1 operates as a power device by applying voltage via the gate pad 20 to a semiconductor layer formed in the silicon substrate 10.

The silicon substrate 10 is a substrate for forming various semiconductor layers, and, for example, a drift layer and a collector layer are formed therein. In the case where the semiconductor device 1 is an n-channel IGBT as a not-limited example, a channel is formed in a p-type semiconductor layer formed in an upper part of an n-type drift layer by applying voltage from the gate pad 20 via the oxide film 12. A collector current flows from a collector to an emitter electrode formed on the silicon substrate 10 via the p-type semiconductor layer, the n-type drift layer, and the channel. As a matter of course, in the case where the semiconductor device 1 is a p-channel IGBT, a collector current is appropriately output based on the voltage applied to the gate pad 20.

The oxide film 12 is a gate insulating film formed as a first layer on the silicon substrate 10 and is formed, for example, of a thermal oxide film ($SiO_2$) obtained by thermally oxidizing Si. Besides, as another example, the thermal oxide film may be replaced by a thermal nitride film (SiON) obtained by thermally nitriding Si.

The interlayer film 14 is an interlayer insulating film formed on the oxide film 12 and separates wiring placed on the silicon substrate 10. The interlayer film 14 is, for example, an insulating film obtained by doping fluorine or the like into the $SiO_2$ film.

The polysilicon 16 is selectively formed in the interlayer film 14 on the oxide film 12 of the silicon substrate 10 in a manner to be in contact with the barrier metal 18. In a process of manufacturing the semiconductor device 1, a silicide composed of the polysilicon 16 and the material of the barrier metal 18 is formed. The formation of the silicide improves the adhesiveness between the silicon substrate 10 and the barrier metal 18 (and the gate pad 20). In this embodiment, the interlayer film 14 and the polysilicon 16 form a second layer 2.

The barrier metal 18 is a metal film formed between the polysilicon 16 (a predetermined region of the second layer 2) and the gate pad 20. The barrier metal 18 is a metal film formed for preventing the diffusion or preventing the cross reaction of metal materials used for the gate pad 20. For the barrier metal 18, for example, a material which forms the silicide with the polysilicon 16 and is excellent in adhesiveness with the gate pad 20 is used.

The gate pad 20 operates as a gate electrode and controls a current flowing through the semiconductor device 1 by a voltage input into the gate pad 20. For the gate pad 20, for example, Al, AlSi, AlCu, AlSiCu, Cu, Au, W, WSi, Ti, TiSi or the like may be used.

Depending on the material of the gate pad 20, the material of the barrier metal 18 is appropriately selected. For the barrier metal 18, for example, Ti or TIN may be used when the gate pad 20 is Al or AlSi, or Ta or TaN may be used when the gate pad 20 is Cu. Further, the material of the gate pad 20 is not limited to these materials, but only needs to be suitably formed of a material having following characteristics. In the following, as an example, the gate pad 20 is explained as AlSi and the barrier metal 18 is explained as Ti or TIN.

In this embodiment, the polysilicon 16 and the barrier metal 18 are in contact with each other not at a flat surface as an interface but have a projecting and recessed part (first projection and recess) 100 selectively formed in a cross-section. A height (or depth) h of the projecting and recessed part 100 is sufficiently deeper or lower than a projection and recess (up to about 150 nm) occurring when a first surface 16a of the polysilicon 16 is formed as the flat surface. For example, h may be about 300 to 600 nm, and is made sufficiently 30 deeper or lower than the projection and recess occurring when the polysilicon 16 is formed. In other words, a recces of the projecting and recessed part 100 formed on the polysilicon 16 has a sufficiently larger depth than the depth of the projection and recess which may occur when the polysilicon 16 is formed flat.

The recess of the projecting and recessed part (first projection and recess) 100 may be deeper or lower than a first surface surrounding the first projection and recess 100. The first surface 16a is a plain surface, however, the first surface 16a has the tiny projection and recess unintentionally produced in the semiconductor manufacturing process. In this case, a height of the projection and recess of the first surface 16a corresponds to a height of the projection and recess occurring when the first surface 16a of the polysilicon is formed as the flat surface.

Note that on the barrier metal 18, a meal film of W or the like may be formed, to an extent not to fill up the projection and recess, in a region of a side wall of the projecting and recessed part formed on the barrier metal 18.

According to this shape, the gate pad 20 is also formed having a projection and recess. The gate pad 20 formed in this manner can suppress bonding peeling between the silicon substrate 10 and the gate pad 20 by the anchoring effect. Further, the formation of the silicide at the interface can further suppress the bonding peeling. Besides, when the metal film of W or the like is formed at the contact surface between the gate pad 20 and the barrier metal 18, this metal film can further improve the adhesiveness. These characteristics are the same in the following embodiments.

The manufacturing process of the semiconductor device 1 according to this embodiment will be explained using FIG. 2 to FIG. 11.

Figure 2:
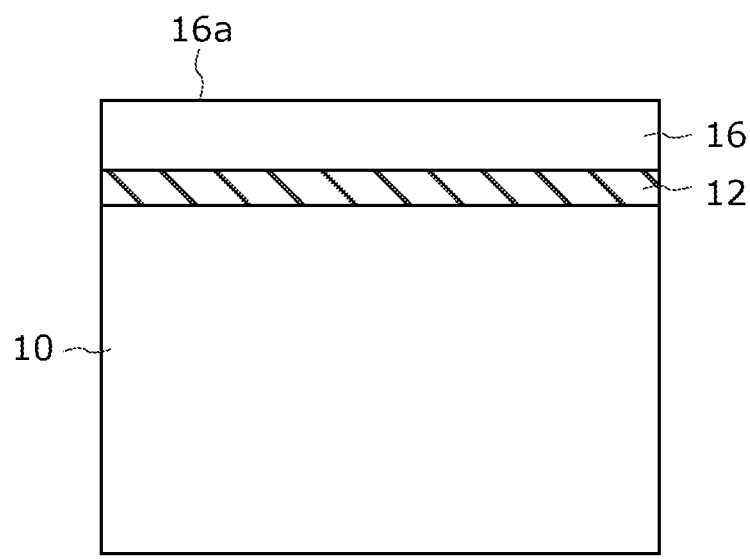
FIGS. 2 to 11 are sectional views schematically illustrating processes of the semiconductor device according to an embodiment.

First, as illustrated in FIG. 2, the semiconductor layer is formed in the silicon substrate 10 by various processes so as to suitably operate, and the oxide film 12 is formed on the upper surface of the silicon substrate 10. Then, the polysilicon 16 is formed on the upper surface of the oxide film 12. This process is executed by a general process.

Figure 3:
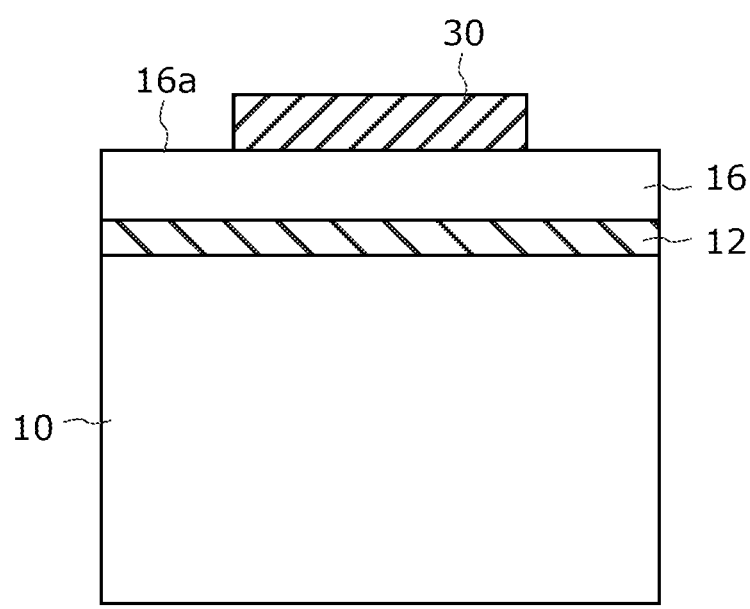

Next, as illustrated in FIG. 3, a mask 30 is selectively formed on the upper surface of the polysilicon 16. The mask 30 is formed according to a region where the gate electrode is arranged on the silicon substrate 10 such that the polysilicon 16 is formed on the region. In the case of photolithography, the mask 30 is photoresist.

Figure 4:
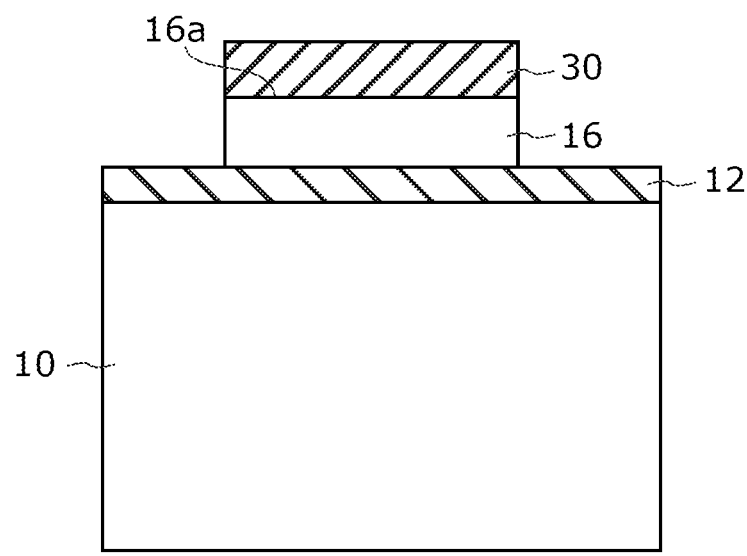

Next, as illustrated in FIG. 4, the polysilicon 16 is etched. This etching may be executed by RIE (Reactive Ion Etching) or CDE (Chemical Dry Etching).

Figure 5:
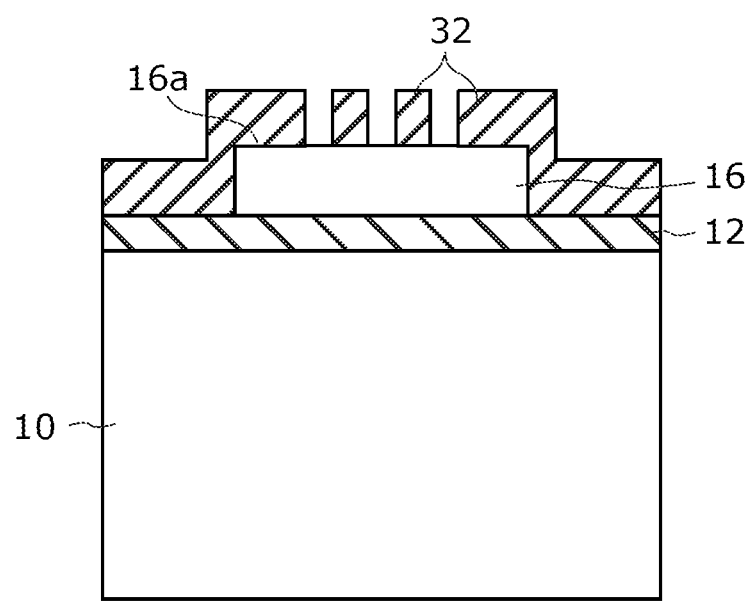

Next, as illustrated in FIG. 5, the mask 30 formed in the process of FIG. 3 is removed once, and a new mask 32 is formed. The mask 32 is selectively formed in a manner that the projecting and recessed part is suitably generated on the polysilicon 16.

Figure 6:
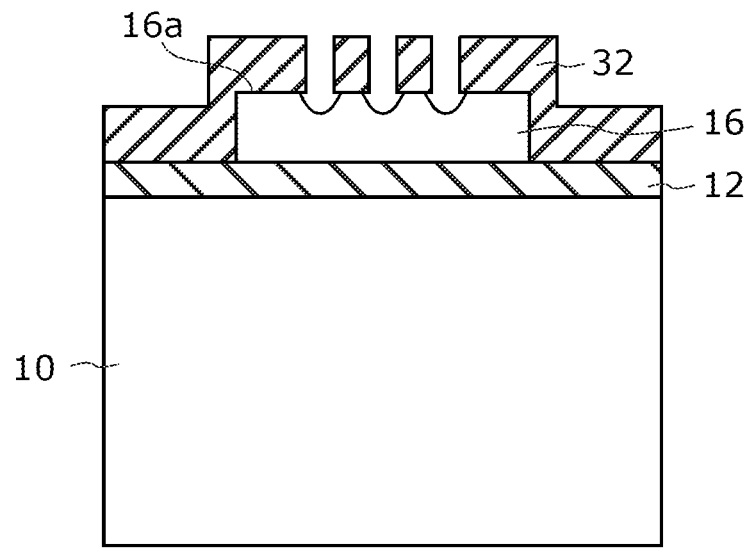

Next, as illustrated in FIG. 6, second etching (for example, CDE) of the polysilicon 16 is executed. This etching process is executed not to remove the polysilicon 16 down to the interface surface with the oxide film 12 by etching but executed to form a dent in a recess shape having an appropriate depth. More specifically, the material to be etched in an opening portion of the mask is not completely removed unlike the general CDE process, but the process is finished where the material is removed down to the middle. Through this process, the projecting and recessed part 100 illustrated in FIG. 1 is formed.

Figure 7:
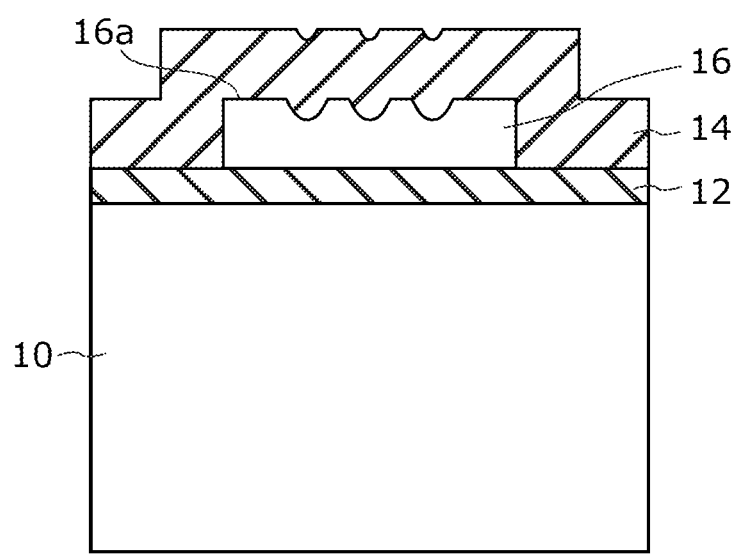

Next, as illustrated in FIG. 7, the mask 32 is removed, and then the interlayer film 14 is formed on upper surfaces of the oxide film 12 and the polysilicon 16.

Figure 8:
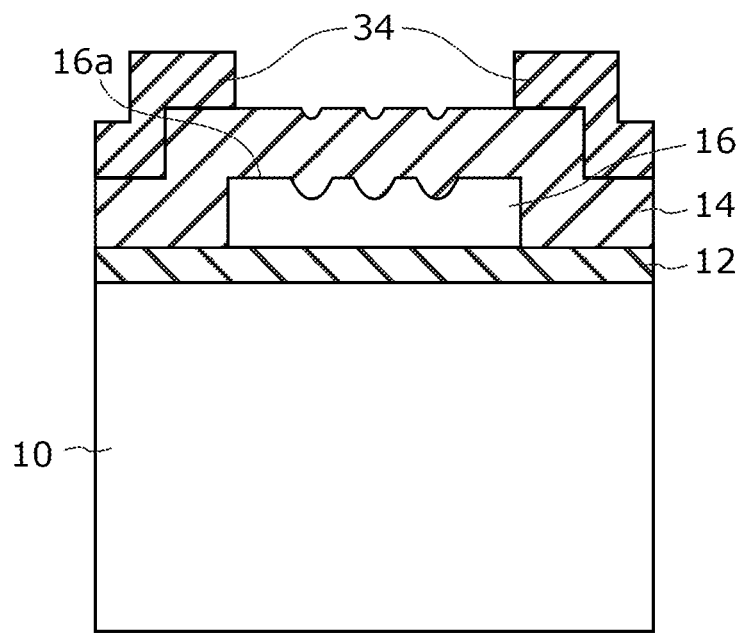

Next, as illustrated in FIG. 8, a mask 34 is formed based on a region where the gate pad is to be formed. The mask 34 is formed so as to secure a contact region in the interlayer film 14 where the polysilicon 16 and the gate pad are electrically connected.

Figure 9:
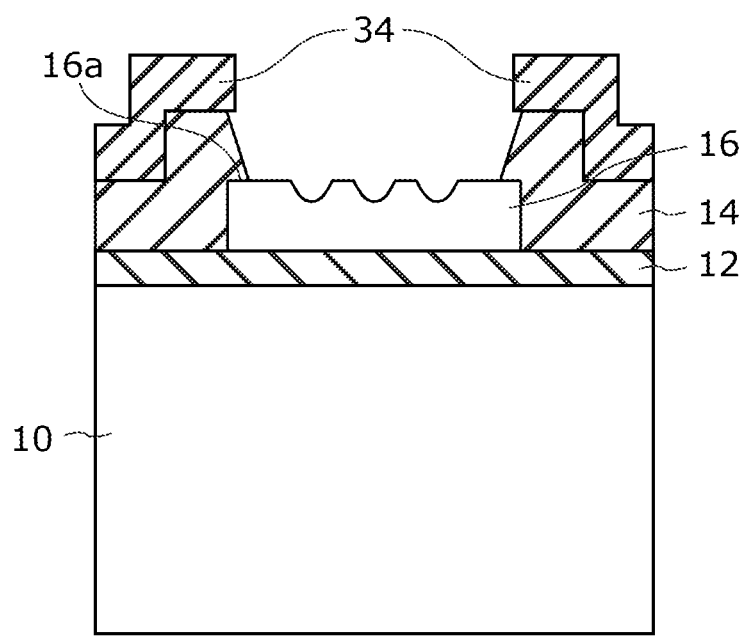

Next, as illustrated in FIG. 9, the interlayer film 14 is selectively removed by the RIE treatment to form the contact region.

Figure 10:
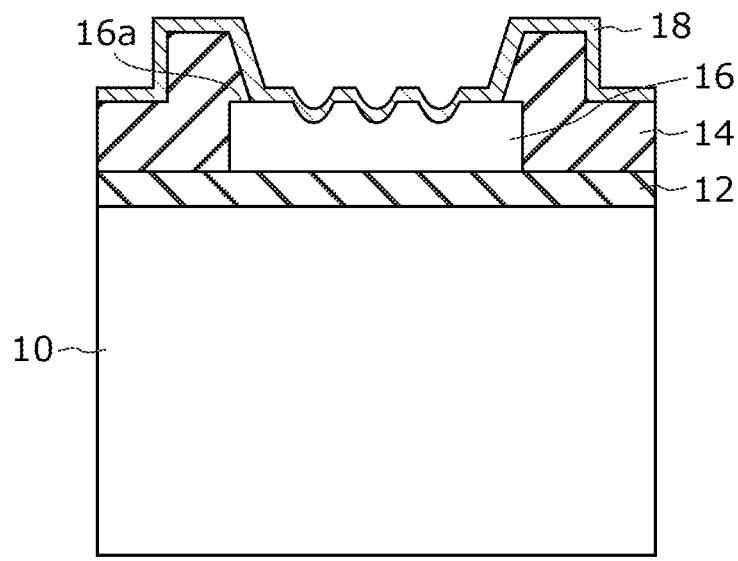

Next, as illustrated in FIG. 10, the mask 34 is removed, and then the barrier metal 18 is film-formed on the upper surfaces of the interlayer film 14 and the polysilicon 16.

Figure 11:
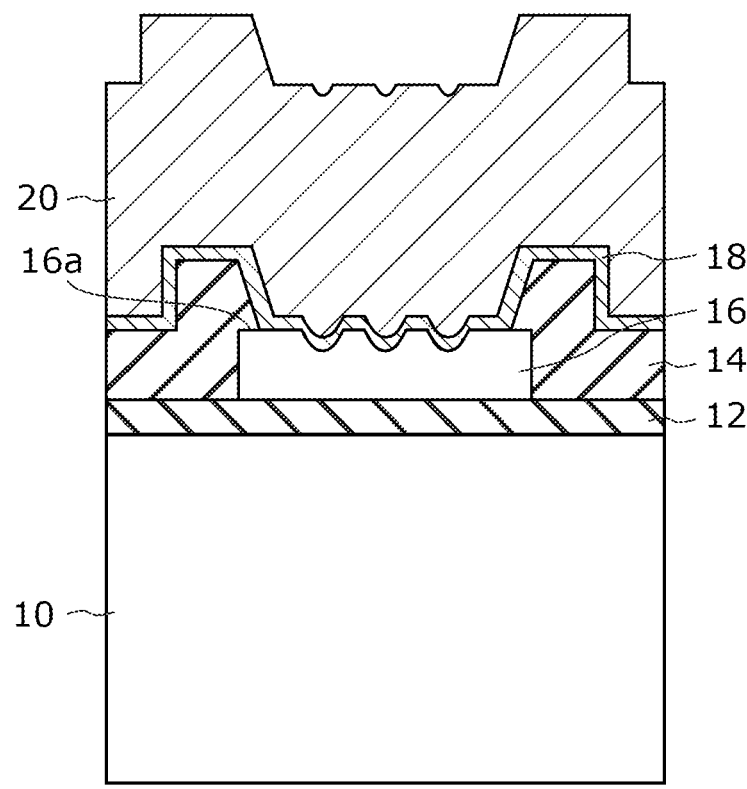

Next, as illustrated in FIG. 11, a conductor forming the gate pad 20 is film-formed on the upper surface of the barrier metal 18. Excessive portions of the conductor and the barrier metal are removed in a manner to remain in a suitable region, whereby the semiconductor device 1 illustrated in FIG. 1 is manufactured.

As an example, the process may be executed so that the polysilicon 16 is 1000 nm in FIG. 2, the width of the opening portion of the mask 32 is 450 nm in FIG. 5, and the depth and the width of a recessed part (recess) of the polysilicon 16 are 300 nm and 500 nm respectively in FIG. 6, but they are not limited to these sizes.

Second Embodiment

Figure 12:
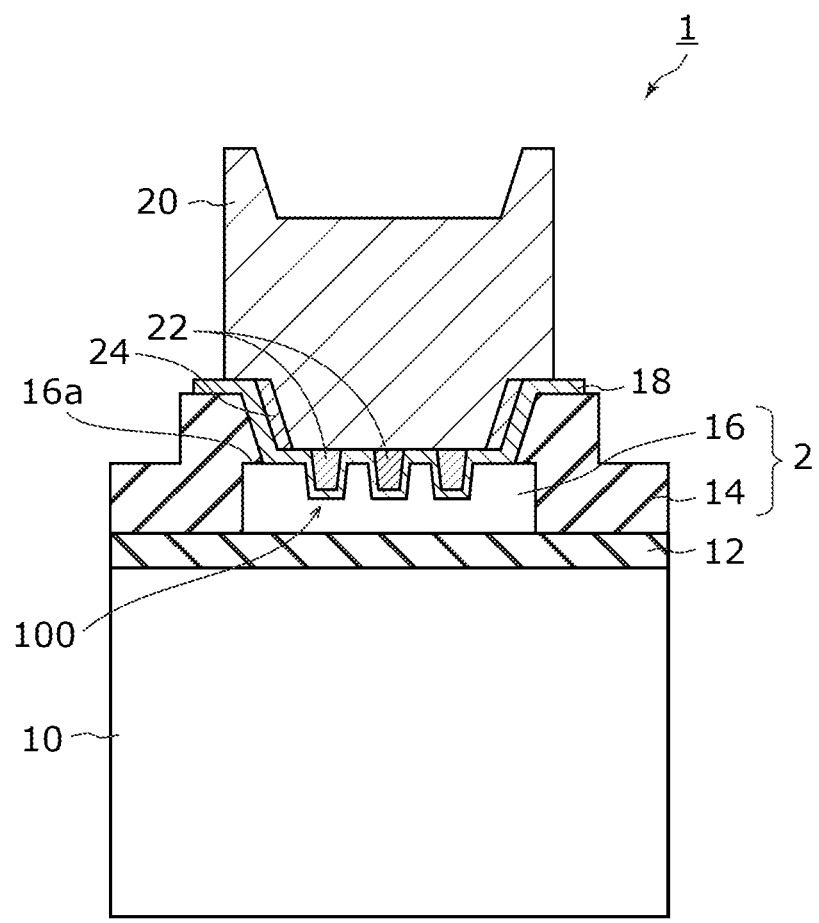
FIGS. 12 to 15 are sectional views schematically illustrating a part of the semiconductor device according to an embodiment.

FIG. 12 is a sectional view schematically illustrating a part of a semiconductor device according to a second embodiment.

The semiconductor device 1 has a plug 22 in the projecting and recessed part 100. Further, the semiconductor device 1 may include a metal film 24 between the barrier metal 18 and the gate pad 20 at a side wall of a contact region of the gate pad 20.

The plug 22 is a plug formed of, for example, W and is formed to fill the projecting and recessed part 100. In other words, W is formed so as to flatten a projection and recess region caused by the projecting and recessed part 100 formed on the barrier metal 18.

The gate pad 20 is formed on the upper surface flattened by the plug 22. Since the lower surface is flat, the upper surface in the contact region of the gate pad 20 is also formed flat after the film-formation of the gate pad 20.

The width and the depth of the projecting and recessed part 100 may be made to be, for example, 500 nm and 300 nm respectively as in the first embodiment, and the depth may be changed in a range of 300 to 600 nm or the like.

To form the plug 22, the projecting and recessed part 100 of the polysilicon 16 may be formed not to change in width as compared with the first embodiment.

In order for the formation, for example, the process in FIG. 6 is executed by RIE in this embodiment. After the RIE treatment, the barrier metal 18 is film-formed and then the plug 22 and the metal film 24 are formed using, for example, W. Thereafter, patterning is performed so as to appropriately form the plug 22 and the metal film 24, and the entire surface is etched back again by RIE. The etch back of the entire surface in the contact region after the film-formation of metal such as W forms the plug 22, and the etch back process similarly forms the metal film 24 on the side wall of the contact region. The metal film 24 may be removed as needed, but the metal film 24 causes no problem even if it exists.

According to this embodiment, the bonding peeling can be suppressed by the anchoring effect as in the first embodiment. Further, filling up the recessed part of the polysilicon with the plug flattens the upper surface of the gate pad 20 formed thereon. The flattening the upper surface of the gate pad 20 can improve the adhesiveness of the wire in bonding.

Note that the width of the plug 22 is, but not limited to, 500 nm as an example, and only needs to be a width with which the plug can be appropriately formed.

Third Embodiment

Figure 13:
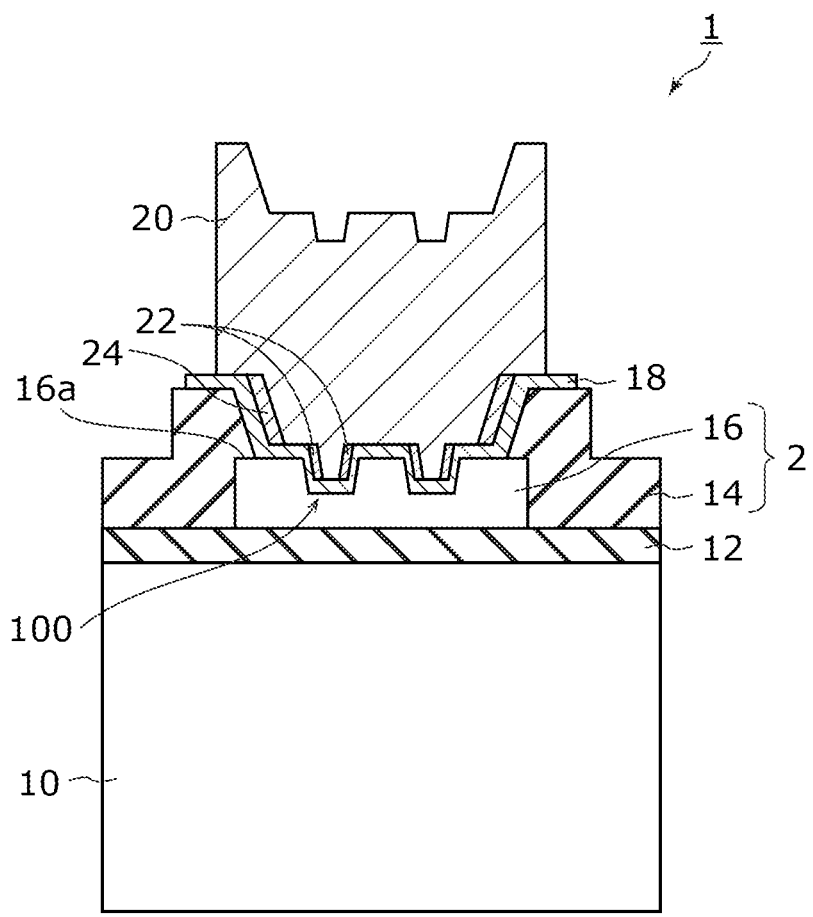

FIG. 13 is a sectional view schematically illustrating a part of a semiconductor device according to a third embodiment.

The projecting and recessed part 100 may be configured to include a plug 22 along its side wall. More specifically, unlike the second embodiment, the recessed part of the barrier metal 18 along the projecting and recessed part 100 is not filled but the plug 22 may be provided along the side wall of the recessed part. To this end, the width of the projecting and recessed part 100 may be made larger than that in the second embodiment. The width of the projecting and recessed part 100 can be made to be, but not limited to, for example, 5 μm, and can be made to be a width with which the recessed part of the barrier metal 18 is not filled up with metal (for example, W).

The process of the semiconductor device 1 is almost the same as that in the second embodiment other than that the width of the projecting and recessed part 100 is made larger. However, metal is formed to an extent not to fill up the recessed part of the barrier metal 18 in the process of film-forming the plug 22.

The formation of the projection and recess on the surface of the polysilicon in contact with the barrier metal can suppress the bonding peeling by the anchoring effect.

Fourth Embodiment

Figure 14:
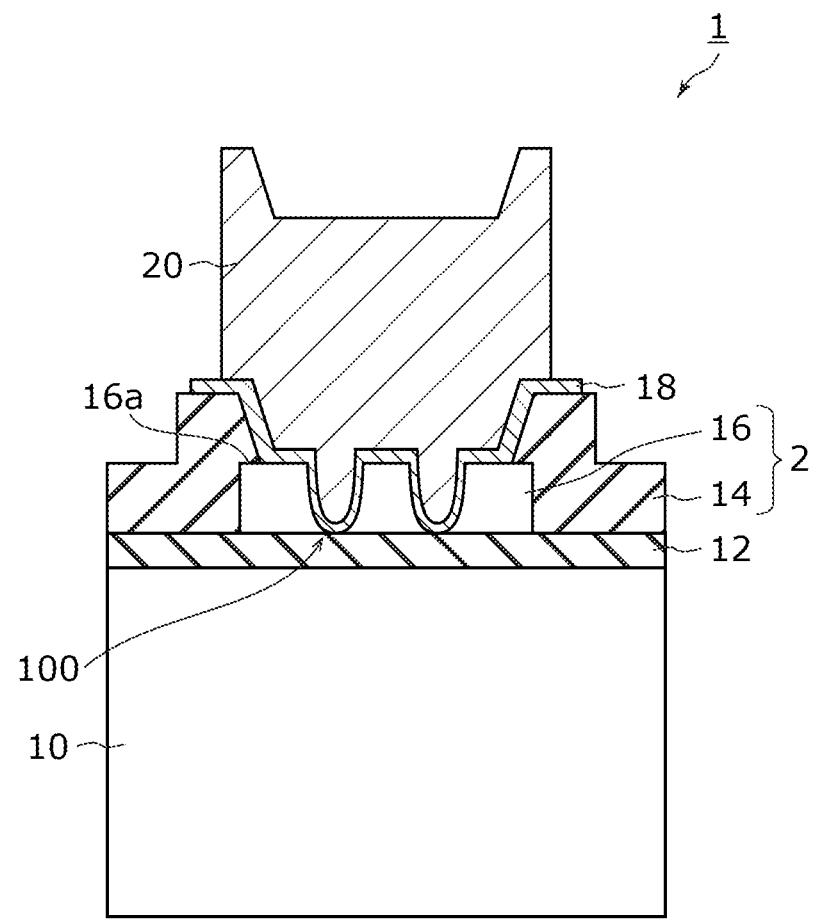

FIG. 14 is a sectional view schematically illustrating a part of a semiconductor device according to a fourth embodiment.

The projecting and recessed part 100 formed in the polysilicon 16 may have a form in contact with the oxide film 12 at least at its lowermost surface. Also in the semiconductor device 1 of this embodiment, the metal film 24 may be formed on the side wall of the recessed part of the barrier metal 18 and a side wall region of the contact region of the gate pad 20 in the barrier metal 18. The width of the projecting and recessed part 100 can be made to be, but not limited to, for example, 5 μm.

The process of the semiconductor device 1 is implemented by suitably increasing the pattern width of the mask in the process in FIG. 5 and etching the polysilicon 16 by its height by CDE in the process in FIG. 6. The subsequent process is the same as that in the first embodiment.

The projection and recess is thus formed on the surface of the polysilicon 16 in contact with the barrier metal 18, thereby suppressing the bonding peeling by the anchoring effect.

Fifth Embodiment

Figure 15:
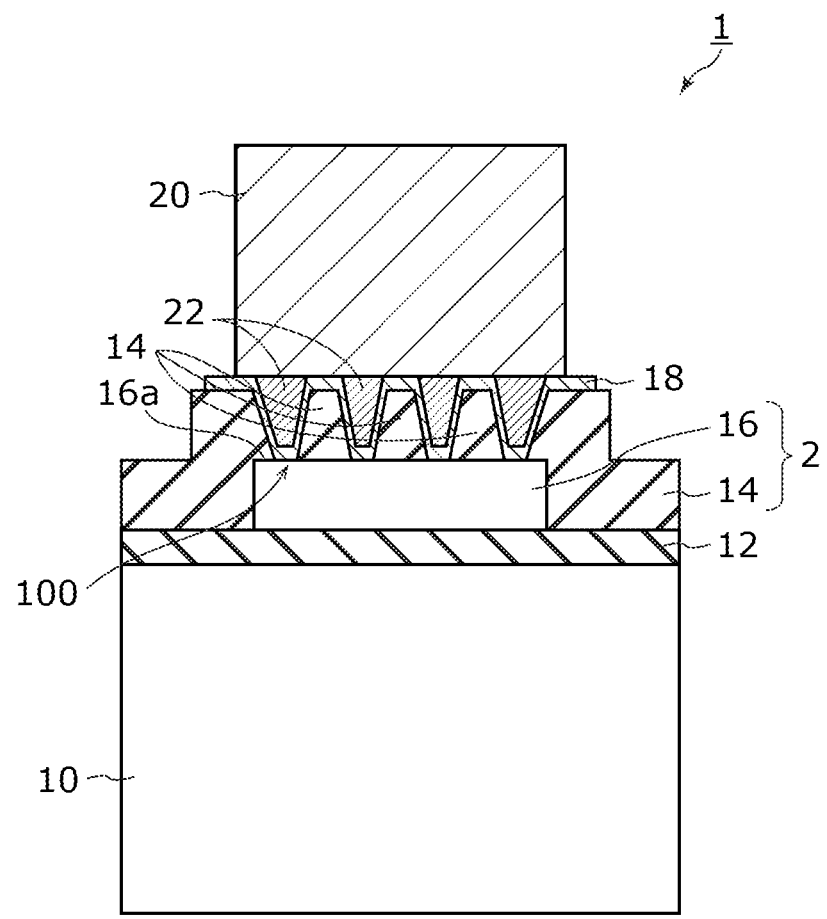

FIG. 15 is a sectional view schematically illustrating a part of a semiconductor device according to a fifth embodiment.

In the semiconductor device 1, the projecting and recessed part 100 is formed by the interlayer film 14 on the upper surface of the polysilicon 16 in the second layer 2. The projecting and recessed part 100 formed by the interlayer film 14 is formed such that the polysilicon 16 and the barrier metal 18 are in contact with each other, at its lower surface. The width of the recessed part (recess) is, for example, 500 nm.

Then, at the recessed part caused by the projecting and recessed part 100 in the barrier metal 18, the plug 22 is formed such that the recessed part is filled.

The process of the semiconductor device 1 will be explained. The processes in FIG. 2 to FIG. 4 are the same as those in the first embodiment. Thereafter, the processes in FIG. 5 and FIG. 6 are not performed but the formation process of the interlayer film 14 in FIG. 7 is executed. As an example, the interlayer film 14 may be formed up to a height of 1000 nm.

Figure 16:
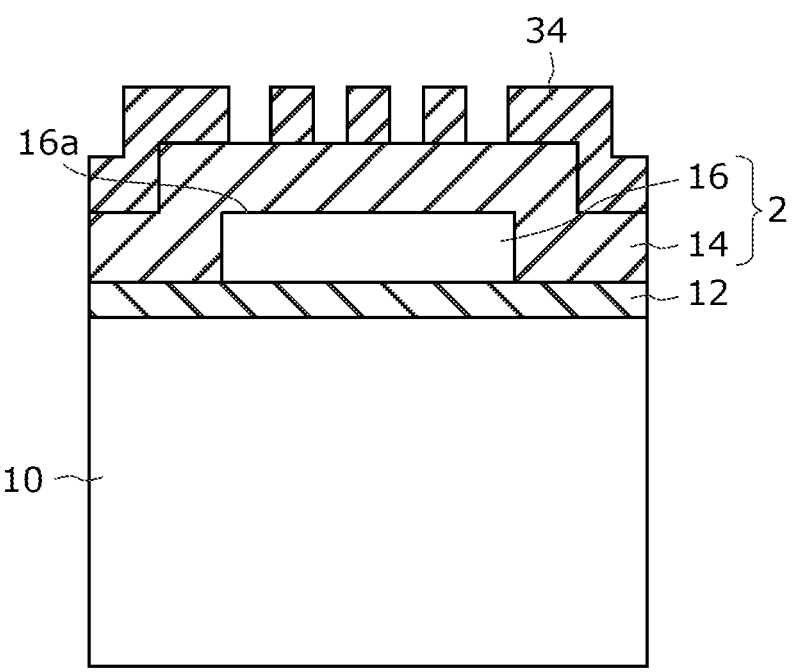
FIGS. 16 and 17 are sectional views schematically illustrating processes of the semiconductor device according to an embodiment.
Figure 17:
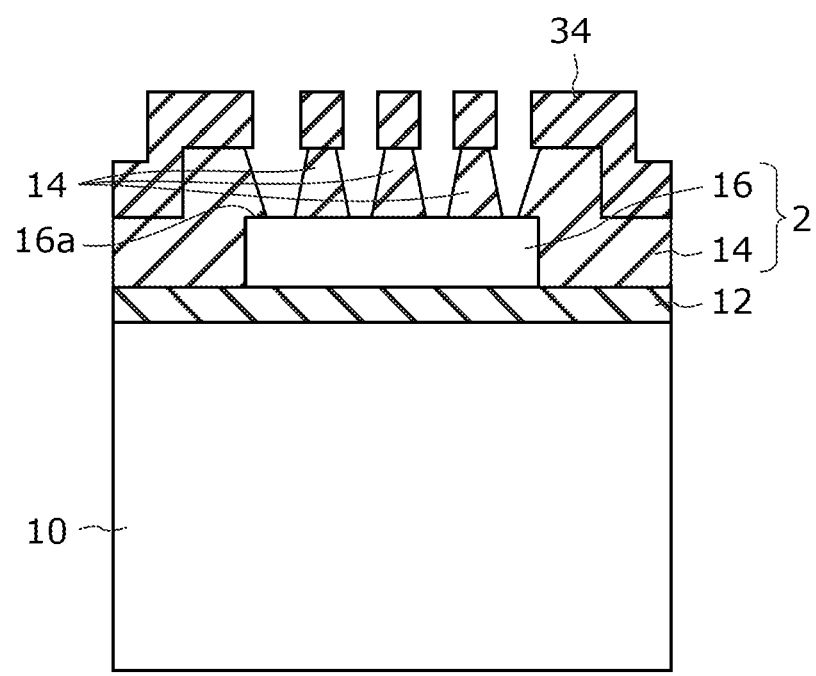

FIG. 16 and FIG. 17 are sectional views schematically illustrating subsequent processes.

After the formation of the interlayer film 14, a mask 34 is formed based on the pattern for forming the projecting and recessed part using the interlayer film 14 as illustrated in FIG. 16.

Next, as illustrated in FIG. 17, the interlayer film 14 is etched by RIE. In the above example, the interlayer film 14 is etched by 1000 nm, thereby enabling the formation of the projecting and recessed part using the interlayer film 14 so that the barrier metal 18 can come into contact with the polysilicon 16 at the lower surface of the recessed part.

The subsequent process is the same as that in the second embodiment.

As above, the formation of the projection and recess on the surface of the second layer 2 in contact with the barrier metal 18 can suppress the bonding peeling by the anchoring effect. Further, in this embodiment, filling the recessed part of the interlayer film 14 with the plug 22, thereby flattening the upper surface of the gate pad 20 formed thereon. The flattening the upper surface of the gate pad 20 can improve the adhesiveness of the wire in bonding. A void width of the recessed part of the interlayer film is, but not limited to, for example, 500 nm, and may take an arbitrary value as long as it is a value with which the plug 22 is formed.

Sixth Embodiment

Figure 18:
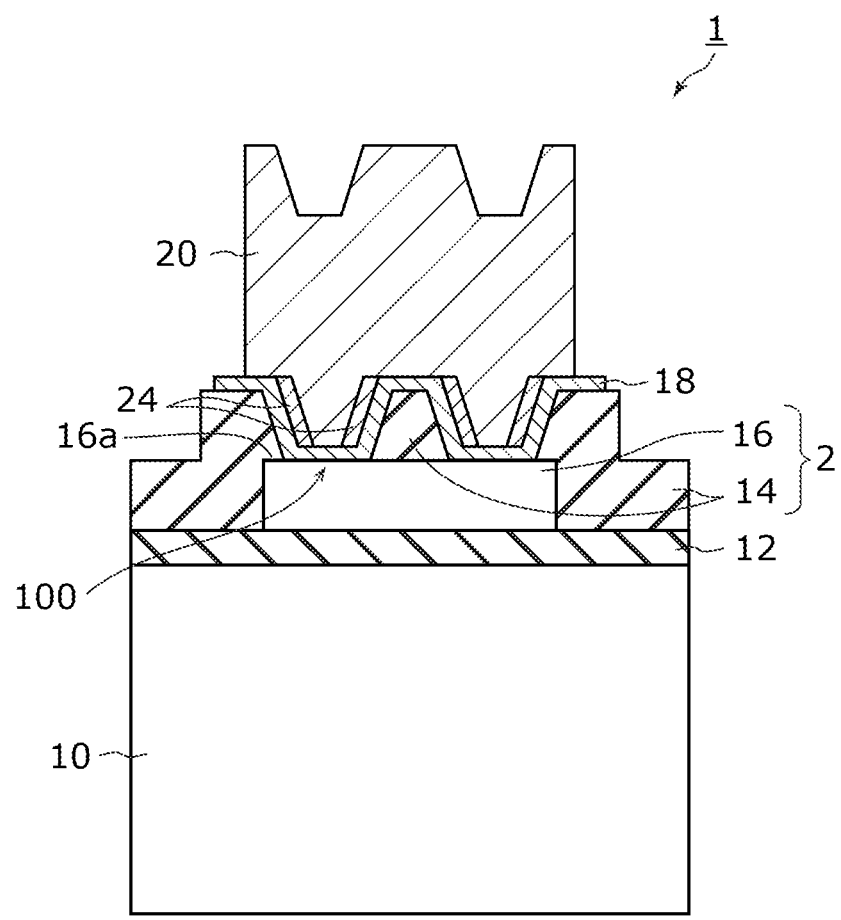
FIGS. 18 to 21 are sectional views schematically illustrating a part of the semiconductor device according to an embodiment.

FIG. 18 is a sectional view schematically illustrating a part of a semiconductor device according to a sixth embodiment.

In the semiconductor device 1, the projecting and recessed part 100 is formed using the interlayer film 14 in the second layer 2 as in the fifth embodiment. The metal film 24 is formed on the side wall of the recessed part by the projecting and recessed part 100 on the upper surface of the barrier metal 18.

The process of this semiconductor device 1 is the one made by combining those of the above-explained fifth embodiment and third embodiment. More specifically, in the etching of the interlayer film 14 in the fifth embodiment, the pattern of the mask 34 is changed, and the mask 34 is arranged so that the void width of the recessed part of the second layer 2 is, for example, 5 μm in etching of the interlayer film 14 in the fifth embodiment. Thereafter, the interlayer film 14 is etched as in the fifth embodiment. Subsequent to the etching, the process of forming the metal film 24 on the side wall of the recessed part of the barrier metal 18 is executed as in the third embodiment.

The formation of the projection and recess on the surface of the second layer 2 in contact with the barrier metal 18 can suppress the bonding peeling by the anchoring effect.

Seventh Embodiment

Figure 19:
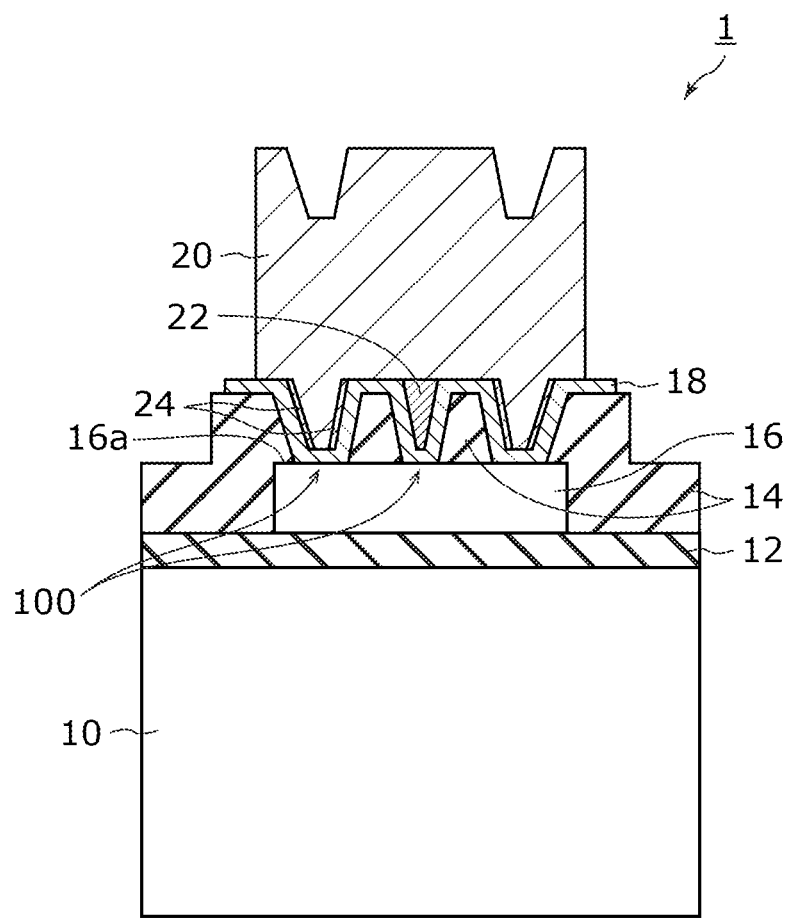

FIG. 19 is a sectional view schematically illustrating a part of a semiconductor device according to a seventh embodiment.

In the semiconductor device 1, the projecting and recessed part 100 is formed using the interlayer film 14 in the second layer 2 as in the fifth embodiment. Then, the plug 22 is formed on the upper surface of the barrier metal 18 in at least one projecting and recessed part 100 in the interlayer film 14, and the metal film 24 is formed on the side wall of the barrier metal 18 in the projecting and recessed part 100 where the plug 22 is not formed. The lower surface of the recessed part of the barrier metal 18 is in contact with the polysilicon 16.

The void widths of the recessed parts are, but not limited to, 500 nm and 5 μm as examples in the projecting and recessed parts 100 of the interlayer film 14. In the recessed part having the void width of 500 nm, the recessed part formed in the barrier metal 18 has the plug 22. In the recessed part having the void width of 5 μm, the metal film 24 is formed on the side wall of the barrier metal 18.

The process of this semiconductor device 1 can be implemented by the process similar to that in the fifth embodiment by changing the pattern of the mask for forming the projecting and recessed part 100.

The formation of the projection and recess on the surface of the interlayer film 14 in contact with the barrier metal 18 as above can suppress the bonding peeling by the anchoring effect. The case where the widths of the recessed parts of the interlayer film are 500 nm and 5 μm is explained in this embodiment, and the widths can take arbitrary values as long as they are a values with which the plug 22 can be formed and a value with which the metal film 24 is formed without forming the plug 22, respectively.

Eighth Embodiment

Figure 20:
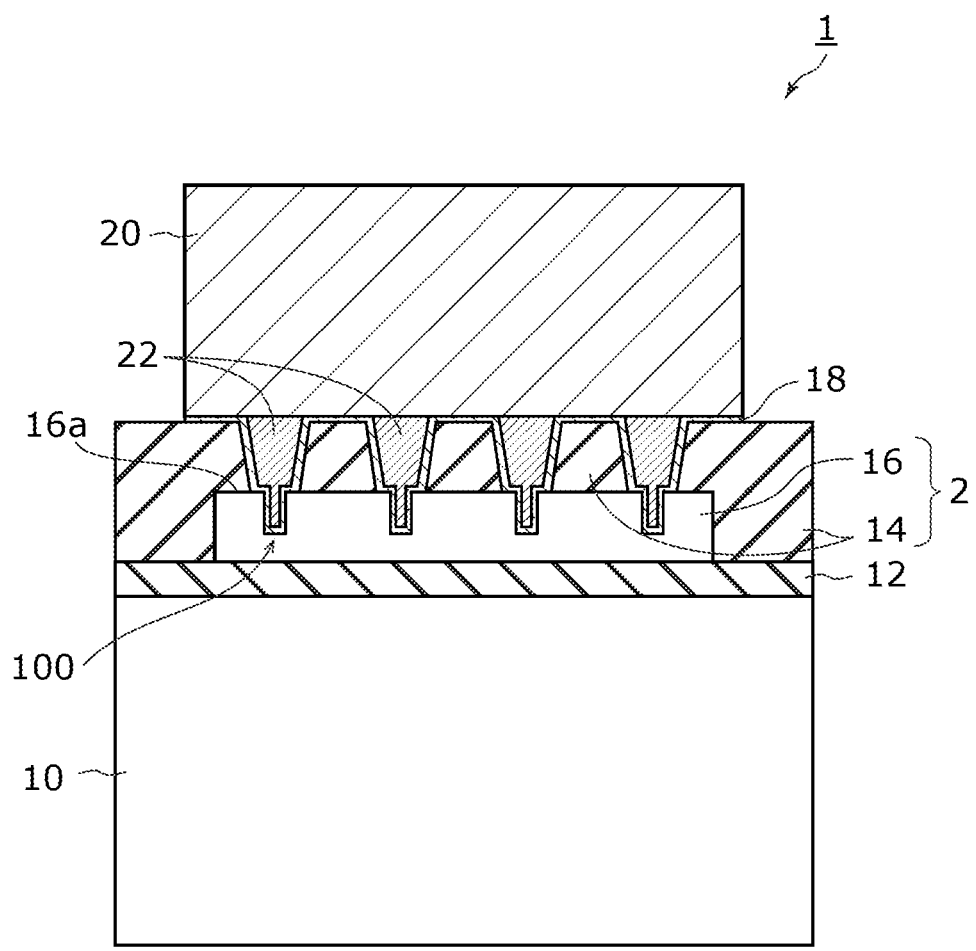

FIG. 20 is a sectional view schematically illustrating a part of a semiconductor device according to an eighth embodiment.

This semiconductor device 1 is constituted such that the second layer 2 includes the interlayer film 14 and the polysilicon 16. The projecting and recessed part 100 is formed at two stages. More specifically, the projecting and recessed part 100 is formed of the recessed part formed in the polysilicon 16 and the projecting part formed using the interlayer film 14 on the upper surface of the polysilicon 16.

In the projecting and recessed part 100, the plug 22 is formed via the barrier metal 18. The gate pad 20 is formed in contact with the upper surfaces of the plug 22 and the barrier metal 18.

The process of the semiconductor device 1 can be implemented by performing isotropic etching such as RIE in FIG. 5 to FIG. 6 and patterning the mask so as to form the projection and recess by the interlayer film 14 in FIG. 8 to FIG. 9.

As an example where the numerical values are not limited, the void width and the height of the recessed part of the interlayer film 14 is 500 nm or less and about 1400 nm, respectively. Note that the lower surface of the projecting and recessed part 100 may be formed in a manner to be in contact with the oxide film 12.

The formation of the projection and recess on the surface of the polysilicon and the interlayer film in contact with the barrier metal as above, thereby enabling the suppression of the bonding peeling by the anchoring effect. Further, the filling the recessed parts of the polysilicon 16 and the interlayer film 14 with the plug 22 flattens the surface of the gate pad 20 formed thereon. The flattening the surface of the gate pad 20 can improve the adhesiveness of the wire in bonding. The case where the void widths of the recessed parts of the polysilicon 16 and the interlayer film 14 are, for example, 500 nm is illustrated, and the void widths may take appropriate values as long as they are values with which the plug 22 is formed.

Ninth Embodiment

Figure 21:
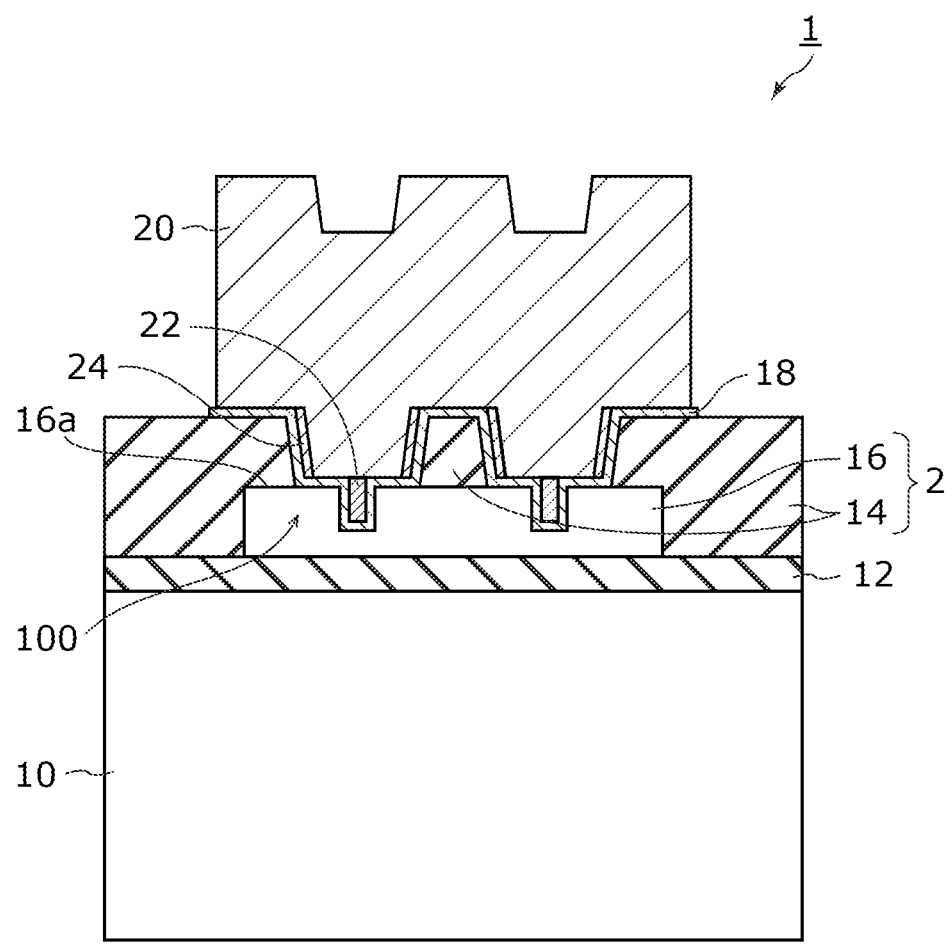

FIG. 21 is a sectional view schematically illustrating a part of a semiconductor device according to a ninth embodiment.

The semiconductor device 1 is configured such that the second layer 2 includes the interlayer film 14 and the polysilicon 16 as in the eighth embodiment. The projecting and recessed part 100 is formed at two stages. More specifically, the projecting and recessed part 100 is formed of the recessed part formed in the polysilicon 16 and the projecting part formed using the interlayer film 14 on the upper surface of the polysilicon 16.

As an example where the numerical values are not limited, the void width of the recessed part of the polysilicon 16 is 500 nm or less, and the recessed part of the polysilicon 16 is filled up with the plug 22. Further, the recessed part (recces) of the polysilicon 16 has a height of about 300 to 600 nm, and has a shape deeper than the projection and recess (about 150 nm) on the surface after the film-formation of the polysilicon 16.

Further, the void width of the recessed part of the interlayer film 14 is 5 µm, and the metal film 24 is formed on the side wall of the recessed part of the interlayer film 14.

The process of the semiconductor device 1 is similar to that in the eighth embodiment. The appropriate control of the width of patterning of the mask in FIG. 8 in the process explained in the eighth embodiment can manufacture the semiconductor device 1 according to this embodiment.

As an example where the numerical values are not limited, the polysilicon 16 is film-formed into 1000 nm on the upper surface of the oxide film 12. Then, a void pattern having a width of 500 nm is formed on the polysilicon 16 by an appropriate etching process, and etching is performed to have a width of 500 nm. As a result of this, a recessed part having a height of 300 nm and a width of 500 nm is formed on the surface of the polysilicon 16.

Next, the interlayer film 14 is formed into 1000 nm, then a void pattern having a width of 5 µm is formed above the recessed part of the polysilicon 16, and the interlayer film 14 is etched. As a result of this, a recessed part having a width of 5 µm is formed on the surface of the interlayer film 14.

Thereafter, the barrier metal 18, the plug 22, the metal film 24, and the gate pad 20 are formed, whereby the semiconductor device 1 according to this embodiment can be manufactured. Note that the lower surface of the projecting and recessed part 100 may be formed to come into contact with the oxide film 12 as in the eighth embodiment.

The projection and recess is formed on the surfaces of the polysilicon 16 and the interlayer film 14 in contact with the barrier metal 18 as above, thereby enabling the suppression of the bonding peeling by the anchoring effect. The case where the void width of the recessed part of the polysilicon is 500 nm is explained, and the void width can take an arbitrary value as long as it is a value with which the plug 22 is formed. Further, the case where the void width of the recessed part of the interlayer film 14 is 5 µm is explained, and the void width can take an arbitrary value as long as it is a value with which the plug 22 is not formed.

Tenth Embodiment

In each of the above embodiments, the section of the projecting and recessed part 100 is explained. Various forms of the projecting and recessed part 100 in a plan view will be explained in this embodiment. In each of the drawings, the shape of the projecting and recessed part 100 formed in the second layer 2 is illustrated in a plan view. FIG. 22 to FIG. 27 are views illustrating several not-limited examples in a plan view of the shape of the projecting and recessed part 100 formed in the second layer 2.

Figure 22:
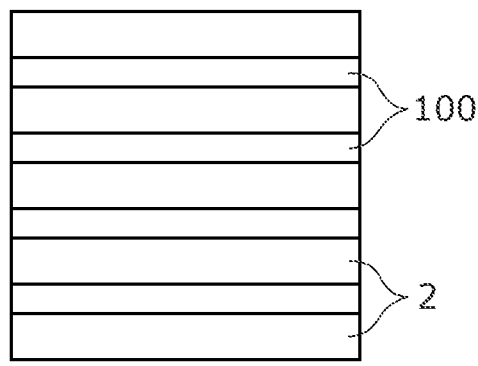
FIGS. 22 to 27 are plan views schematically illustrating examples of a projecting and recessed part according to an embodiment.

As illustrated in FIG. 22, the projecting and recessed parts 100 may be formed in a stripe shape in the second layer 2.

Figure 23:
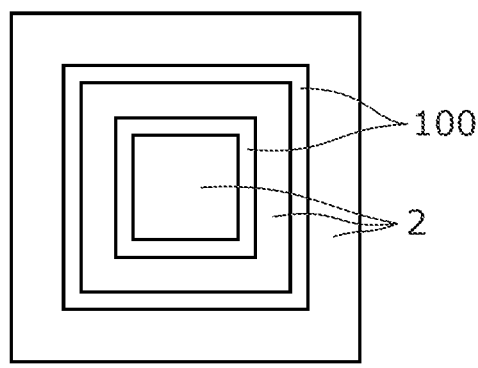

As illustrated in FIG. 23, each of the projecting and recessed parts 100 may be formed in a quadrangular shape having a width in the second layer 2.

Figure 24:
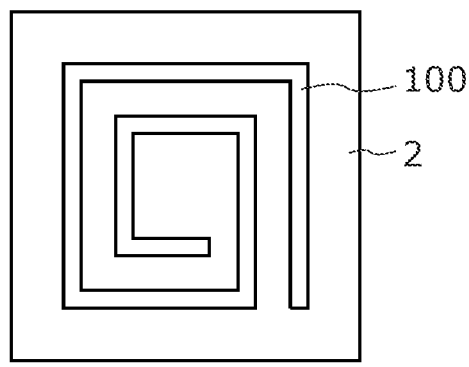

As illustrated in FIG. 24, the projecting and recessed part 100 may be formed in a swirl shape having a width in the second layer 2. Note that the swirl shape is composed of a quadrangular shape but may be composed of another polygonal shape, or may be a circular swirl shape having no corner (for example, a spiral shape having a width).

Figure 25:
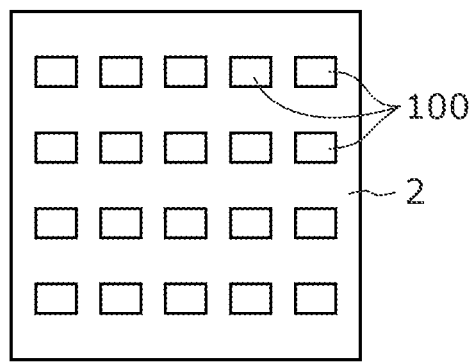

As illustrated in FIG. 25, the projecting and recessed parts 100 may be formed in a shape of a check pattern in the second layer 2.

Figure 26:
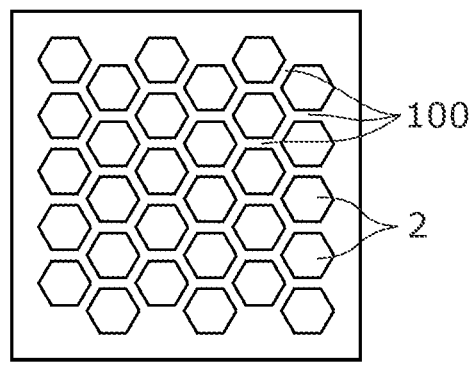

As illustrated in FIG. 26, the projecting and recessed parts 100 may be formed in a honeycomb shape in the second layer 2.

Figure 27:
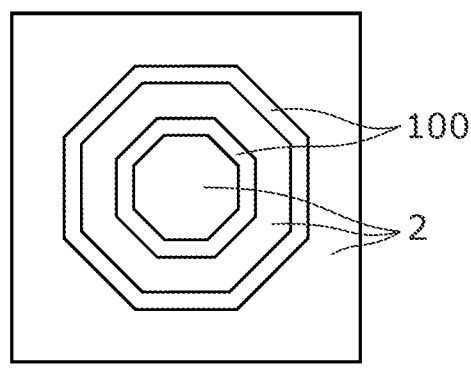

As illustrated in FIG. 27, the projecting and recessed parts 100 may be formed in an octagonal shape in the second layer 2.

In any of the examples, a projection and recess pattern of the polysilicon 16 and the interlayer film 14 can be arranged efficiently using the anchoring effect in consideration of the bonding direction.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, the above embodiments are each explained as an IGBT, but may be a MOSFET. Further, the embodiments are not limited to these examples. The embodiments in this disclosure can be applied to the formation of an electrode in any of a planar type and a trench type in a semiconductor device having an insulating film and an electrode which applies voltage via the insulating film as several not-limited examples.

For example, the semiconductor device may be a diode. When the semiconductor device is the diode, the pad 20 may be an anode pad or a cathode pad. The manufacturing process of the pad 20 (at least one of, the anode pad or the cathode pad) may be same as some above-mentioned embodiments.

As another example, the semiconductor device 1 may have a source pad produced as same semiconductor manufacturing process as the gate pad 20 described in some embodiments.

The invention claimed is:
1. A semiconductor device comprising:
   a semiconductor substrate;
   a first layer formed of an oxide film provided on an upper surface of the semiconductor substrate;
   a second layer which is a layer formed on an upper surface of the first layer and at least selectively having a projection and a recess in an upper surface of the second layer, the projection and the recess being deeper than unintentional fine bumps on an upper surface of the second layer, the unintentional fine bumps occurring during manufacturing process for forming the upper surface of the second layer in a planar shape;
   a barrier metal formed on the upper surface of the second layer according to a shape of the projection and the recess; and
   a pad in close contact with the second layer via the barrier metal.
2. The semiconductor device according to claim 1, which is an IGBT (Insulated Gate Bipolar Transistor) or a MOSFET (Metal-Oxide-Semiconductor Field-Effect Transistor).
3. The semiconductor device according to claim 1, wherein:
   the second layer comprises:
      polysilicon selectively formed on the upper surface of the first layer; and an interlayer film formed at least in a region where the polysilicon is not formed on the upper surface of the first layer; and the projection and the recess are formed on an upper surface of the polysilicon.

4. The semiconductor device according to claim 1, wherein:
the second layer comprises:
polysilicon selectively formed on the upper surface of the first layer; and
an interlayer film formed at least in a region where the polysilicon is not formed on the upper surface of the first layer; and
the projection and the recess are formed of the interlayer film selectively arranged on an upper surface of the polysilicon.

5. The semiconductor device according to claim 1, further comprising
a metal plug formed at least on a side wall of a projection and a recess of the barrier metal formed according to the projection and the recess in the upper surface of the second layer, on an upper surface of the barrier metal, wherein
the pad is formed on the upper surface of the barrier metal via the plug in at least a partial region.

6. The semiconductor device according to claim 5, wherein:
the plug is formed flat by filling the projection and the recess of the barrier metal formed according to the projection and the recess in the upper surface of the second layer; and
the pad is formed on the upper surface of the barrier metal via the plug.

7. The semiconductor device according to claim 1, wherein
the projection and the recess are formed in a stripe shape, a quadrangular shape, a swirl shape, a check shape, a honeycomb shape or an octagonal shape in plan view.

8. The semiconductor device according to claim 1, wherein a height of each of the unintentional fine bumps is up to about 150 nm.

9. The semiconductor device according to claim 1, wherein the second layer includes a plurality of projections and recesses.

10. A semiconductor device comprising:
a semiconductor substrate;
a first layer formed of an oxide film provided on an upper surface of the semiconductor substrate;
a second layer which is on an upper surface of the first layer and has a projection and a recess in an upper surface of the second layer, the projection and the recess comprising the recess being deeper than fine bumps in a first surface surrounding the projection and the recess;
a barrier metal formed on the upper surface of the second layer according to a shape of the projection and the recess; and
a pad in close contact with the second layer via the barrier metal.

11. The semiconductor device according to claim 10, which is an IGBT (Insulated Gate Bipolar Transistor) or a MOSFET (Metal-Oxide-Semiconductor Field-Effect Transistor).

12. The semiconductor device according to claim 10, wherein:
the second layer comprises:
polysilicon selectively formed on the upper surface of the first layer; and
an interlayer film formed at least in a region where the polysilicon is not formed on the upper surface of the first layer; and
the projection and the recess are formed on an upper surface of the polysilicon.

13. The semiconductor device according to claim 10, wherein:
the second layer comprises:
polysilicon selectively formed on the upper surface of the first layer; and
an interlayer film formed at least in a region where the polysilicon is not formed on the upper surface of the first layer; and
the projection and the recess are formed of the interlayer film selectively arranged on an upper surface of the polysilicon.

14. The semiconductor device according to claim 10, further comprising
a metal plug formed at least on a side wall of a projection and recess of the barrier metal formed according to the projection and the recess in the upper surface of the second layer, on an upper surface of the barrier metal, wherein
the pad is formed on the upper surface of the barrier metal via the plug in at least a partial region.

15. The semiconductor device according to claim 14, wherein:
the plug is formed flat by filling the projection and recess of the barrier metal formed according to the projection and the recess in the upper surface of the second layer; and
the pad is formed on the upper surface of the barrier metal via the plug.

16. The semiconductor device according to claim 1, wherein
the projection and the recess are formed in a stripe shape, a quadrangular shape, a swirl shape, a check shape, a honeycomb shape or an octagonal shape in plan view.

17. The semiconductor device according to claim 10, wherein:
the second layer comprises a silicon layer.

18. The semiconductor device according to claim 10, wherein:
the first surface comprises a plain surface.

19. A manufacturing method of a semiconductor device, comprising:
forming a first layer being an oxide film, on an upper surface of a semiconductor substrate;
forming a second layer on an upper surface of the first layer;
forming a mask based on a pattern of a first projection and recess on an upper surface of the second layer;
forming the first projection and recess on the second layer by an etching treatment based on the mask;
removing the mask;
film-forming a barrier metal on the upper surface of the second layer; and
film-forming a metal which forms a pad on an upper surface of the barrier metal.

20. The manufacturing method according to claim 19, further comprising
film-forming, between the film-forming the barrier metal and the film-forming the metal which forms the pad, a metal different from a metal which forms the barrier metal and the metal which forms the pad, at least on a side wall in a region where the barrier metal formed along the first projection and recess is formed.

\* \* \* \* \*